US007951681B2

(12) United States Patent
Ker et al.

(10) Patent No.: US 7,951,681 B2
(45) Date of Patent: May 31, 2011

(54) SUBSTRATE-TRIGGERED BIPOLAR JUNCTION TRANSISTOR AND ESD PROTECTION CIRCUIT

(76) Inventors: Ming-Dou Ker, Hsinchu (TW); Chyh-Yih Chang, Shinjuang (TW)

(*) Notice: Subject to any disclaimer, the term of this patent is extended or adjusted under 35 U.S.C. 154(b) by 127 days.

(21) Appl. No.: 11/180,714

(22) Filed: Jul. 14, 2005

(65) Prior Publication Data
US 2005/0248891 A1 Nov. 10, 2005

Related U.S. Application Data

(62) Division of application No. 10/309,225, filed on Dec. 4, 2002.

(30) Foreign Application Priority Data

Feb. 6, 2002 (TW) ................................. 91102073 A

(51) Int. Cl.
*H01L 21/331* (2006.01)
(52) U.S. Cl. ......... 438/309; 438/342; 438/353; 438/369
(58) Field of Classification Search .................. 438/309, 438/342, 353, 369
See application file for complete search history.

(56) References Cited

U.S. PATENT DOCUMENTS

| | | | |
|---|---|---|---|
| 5,465,189 A | 11/1995 | Polgreen et al. | |
| 5,825,600 A * | 10/1998 | Watt | 361/56 |
| 5,856,214 A | 1/1999 | Yu | |
| 5,882,967 A | 3/1999 | Brown et al. | |
| 6,051,458 A * | 4/2000 | Liang et al. | 438/224 |
| 6,072,219 A * | 6/2000 | Ker et al. | 257/355 |
| 6,087,227 A | 7/2000 | Hsu | |
| 6,358,781 B1 | 3/2002 | Lee et al. | |
| 6,399,990 B1 * | 6/2002 | Brennan et al. | 257/355 |
| 6,465,848 B2 | 10/2002 | Ker et al. | |
| 6,507,090 B1 | 1/2003 | Hu et al. | |
| 6,566,715 B1 | 5/2003 | Ker et al. | |
| 6,764,892 B2 | 7/2004 | Kunz et al. | |
| 6,872,987 B2 | 3/2005 | Yu | |
| 2001/0043449 A1 * | 11/2001 | Okushima | 361/56 |
| 2003/0147190 A1 | 8/2003 | Ker et al. | |

OTHER PUBLICATIONS

Office Action mailed Mar. 26, 2008, in U.S. Appl. No. 10/309,225, 10 pages.
Response to Office Action mailed Mar. 26, 2008, in U.S. Appl. No. 10/309,225, 8 pages.
Final Office Action mailed Nov. 19, 2007, in U.S. Appl. No. 10/309,225, 8 pages.
Response to Final Office Action mailed Nov. 19, 2007, in U.S. Appl. No. 10/309,225, 9 pages.

(Continued)

*Primary Examiner* — N Drew Richards
*Assistant Examiner* — Jae Lee

(57) ABSTRACT

An ESD protection circuit using a novel substrate-triggered lateral bipolar junction transistor (STLBJT) for providing a discharging path between power rails. The ESD protection circuit comprises an ESD detection circuit and a STLBJT device. The STLBJT device formed in a P-type substrate includes N-type collector and emitter regions coupled to the power rails, respectively. The substrate region between the collector and emitter regions, on which there is no field oxide device, serves as a base of the STLBJT device. The STLBJT device further includes a first P-type region coupled to the ESD detection circuit and a second P-type region coupled to one of the power rails, which are spatially separated from the collector/emitter regions, respectively. The STLBJT device is turned on by substrate-triggering responsive to the signal coming from the ESD detection circuit and establishes the discharging path between the power rails.

18 Claims, 14 Drawing Sheets

OTHER PUBLICATIONS

Response to Official Action in U.S. Appl. No. 10/309,225, 10 pages filed on Apr. 27, 2009.
Official Action Issued in U.S. Appl. No. 10/309,225 on Jul. 10, 2009, 11 pages.
Office Action of Apr. 7, 2010, in U.S. Appl. No. 10/309,225, 8 pages.
Response to Office Action of Apr. 7, 2010, in U.S. Appl. No. 10/309,225, 10 pages.
Official Action in U.S. Appl. No. 10/309,225 issued Jul. 19, 2010, 10 pages.
Response to Official Action in U.S. Appl. No. 10/309,225 issued Jul. 19, 2010, mailed Oct. 19, 2010, 12 pages.
Official Action in U.S. Appl. No. 10/309,225 issued Nov. 2, 2010, 15 pages.
Official Action issued in U.S. Appl. No. 10/309,225 dated Jan. 26, 2009; 13 pages.

* cited by examiner

SUBSTRATE-TRIGGERED BIPOLAR JUNCTION TRANSISTOR AND ESD PROTECTION CIRCUIT

This application is a Divisional of co-pending Application Ser. No. 10/309,225, filed on Dec. 4, 2002, for which priority is claimed under 35 USC §120; the entire contents of which are hereby incorporated by reference.

BACKGROUND OF THE INVENTION

1. Field of the Invention

The present invention relates to an electrostatic discharge (ESD) protection technology, more specifically, to a substrate-triggered lateral bipolar junction transistor (STLBJT) for use in ESD protection and the related ESD protection circuit.

2. Description of the Prior Art

ESD phenomena have become a reliability issue in complementary metal oxide semiconductor (CMOS) integrated circuits (ICs) because of technology scaling and high frequency requirements. For radio frequency (RF) ICs, the on-chip ESD protection design suffers from several limitations, such as low parasitic capacitance, constant input capacitance, insensitivity to substrate coupling noises, and high ESD robustness. A typical requirement of the maximal loading capacitance for an RF input pad is only 200 fF at an operating frequency of 2 GHz. As described herein, this 200 fF target not only includes ESD protection devices but also the bond pad itself. In order to fulfill these requirements, diodes are commonly used for ESD protection in I/O circuits. To deal with these challenges, low-capacitance bond pad and low-capacitance ESD protection circuitry had been proposed with some specific techniques.

Moreover, by adding a turn-on efficient ESD clamp circuit across the power rails of the input ESD protection circuit formed by the diodes, the overall ESD level of the input pin can be significantly improved. FIG. 1 is a circuit diagram of a conventional input ESD protection circuit with a power-rail (VDD-to-VSS) ESD clamp circuit. In FIG. 1, ESD diodes Dp1 and Dn1 are connected to pad 10 and ESD diodes Dp2 and Dn2 are connected to pad 12. Numeral 14 represents an internal circuit and numeral 16 represents the ESD clamp circuit connected between the VDD and VSS power rails. When the ESD pulse is applied to pad 10 and pad 12 is relatively grounded, the ESD current is conducted to the power rail VDD through the forward-biased ESD diode Dp1. The ESD current on the VDD power rail is discharged to the VSS power rail by the efficient VDD-to-VSS ESD clamp circuit 16. Finally, the ESD current is conducted to grounded pad 2 through the forward-biased ESD diode Dn2. The overall discharging path of the ESD current is indicated by a bold line 18 in FIG. 1. By using such ESD protection design, the ESD diodes are all operating in the forward-biased condition to discharge the ESD current. The diode operated in the forward-biased condition can sustain a much higher ESD level with a small device dimension. Thus, the ESD clamp device in the input ESD protection circuit can be realized with smaller device dimensions to significantly reduce the input capacitance of the input ESD protection circuit for high-frequency applications.

Therefore, the turn-on efficient power-rail ESD clamp circuit can significantly improve the ESD robustness of IC products if the power-rail ESD clamp circuit can be turned on efficiently while an ESD event is happening.

In addition, U.S. Pat. No. 5,744,842 disclosed an area-efficient VDD-to-VSS ESD protection circuit. FIG. 2 is a circuit diagram of this ESD protection circuit and FIG. 3 is a cross-section of the ESD protection circuit.

As shown in FIG. 2 and FIG. 3, the ESD protection circuit is composed of an ESD transient detection circuit 102 and an N-type field oxide device 100. The ESD transient detection circuit 102 comprises a resistance-capacitance network, which includes a resistor R and a capacitor C and is connected between the VDD and VSS power rails, and an inverter 104 including a PMOS transistor Mp and an NMOS transistor Mn. The field oxide device 100 is a parasitic bipolar junction device including an N+ collector 302, N+ emitter 304 and a P+ base 300. The RC network has a delay constant longer than the duration of the electrostatic pulse and shorter than the duration of the rising time of VDD power-on. The contact of the resistor R and the capacitor C is electrically coupled to the input of inverter 104. The gate of PMOS transistor Mp is coupled to the gate of NMOS transistor Mn. The sources of PMOS transistor Mp and NMOS transistor Mn are coupled to the VDD and VSS power lines, respectively. The drains of PMOS transistor Mp and NMOS transistor Mn are coupled to base 300 of the field oxide device 100. When the ESD pulse occurs on the VDD power line and the VSS power line is relatively grounded, the gates of PMOS transistor Mp and NMOS transistor Mn maintain a low voltage level since the RC network has a longer delay time constant. Thus, PMOS transistor Mp turns on and NMOS transistor Mn turns off. The initial ESD current flows into the base 300 of the field oxide device 100 through PMOS transistor Mp and then flows to the VSS power line through the substrate pickup 308. At the same time, the initial ESD current raises the base voltage of the parasitic BJT and triggers on the parasitic BJT. Then, the ESD current on the VDD power line flows to the VSS power line through the parasitic BJT.

In '842, the base of the parasitic BJT is defined by a field oxide. However, field oxide can be replaced by shallow trench isolation (STI) in sub-quarter-micron CMOS process because of bird's beak effect of the field oxide. The STI is deeper than the field oxide in silicon substrate. Therefore, the field oxide device in STI technology is hard to turn on.

U.S. Pat. No. 5,581,104 disclosed a grounded-base BJT device serving as an ESD protection device. This grounded-base BJT structure includes a parasitic diode used to aid the triggering of the BJT.

In the above, the power-rail ESD clamp circuit is important to improve the ESD robustness of IC products. As well, the power-rail ESD clamp circuit needs to be triggered efficiently while an ESD event is happening. However, the field oxide device in sub-quarter-micron CMOS process using the STI technology is hard to turn on.

Therefore, the object of the present invention is to provide an ESD protection device and an ESD protection circuit using the same, which has a lower triggering voltage and can be triggered more efficiently as the ESD event occurs, especially in the sub-quarter-micron CMOS process.

SUMMARY OF THE INVENTION

The present invention achieves the above-indicated object by providing an ESD protection circuit for providing a low-resistance path for discharging the ESD current between a first line and a second line, such as between the VDD and VSS power rails and between other signal lines. The ESD protection circuit comprises an ESD detection circuit and a lateral bipolar junction transistor (BJT). The function of the ESD detection circuit is to trigger the lateral BJT as an ESD event occurs, and to send a grounding signal or other signals to turn off the lateral BJT as the circuit is operated normally. The lateral BJT is coupled to an output terminal of the ESD detection circuit and used to provide a discharging path between the first line and the second line. In the preferred embodiments, the lateral BJT is formed in a P-type substrate and includes N+ collector and emitter regions coupled to the first line and the second line, respectively. The substrate region between the collector and emitter regions, on which there is no field oxide or STI, serves as a base of the lateral BJT. In addition, in the P-type substrate, there are first/second P-type doped regions spatially separated from the collector/emitter regions, respectively. The first P-type doped region is connected to the output terminal of the ESD detection circuit and the second P-type doped region is connected to the second line. In addition, STI structures are preferably formed between the collector region and the first doped region and between the emitter region and the second doped region, where the STI structure between the emitter region and the second doped region can be omitted. In the above-mentioned ESD protection circuit, the lateral BJT can be easily triggered by substrate-triggering through the first doped region responsive to the trigger signal coming from the ESD detection circuit, forming the discharging path between the first line and the second line.

Moreover, the substrate-triggered lateral BJT can further comprise some doping regions to enhance the BJT performance. For example, an N-well can be added between the base and the substrate pickup to increase the base resistance. For another example, an N-type region can be added to increase the area of the collector of the lateral BJT.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, which are given by way of illustration only, and thus are not limitative of the present invention, and in which.

DETAILED DESCRIPTION OF THE INVENTION

First Embodiment

Figure 1:
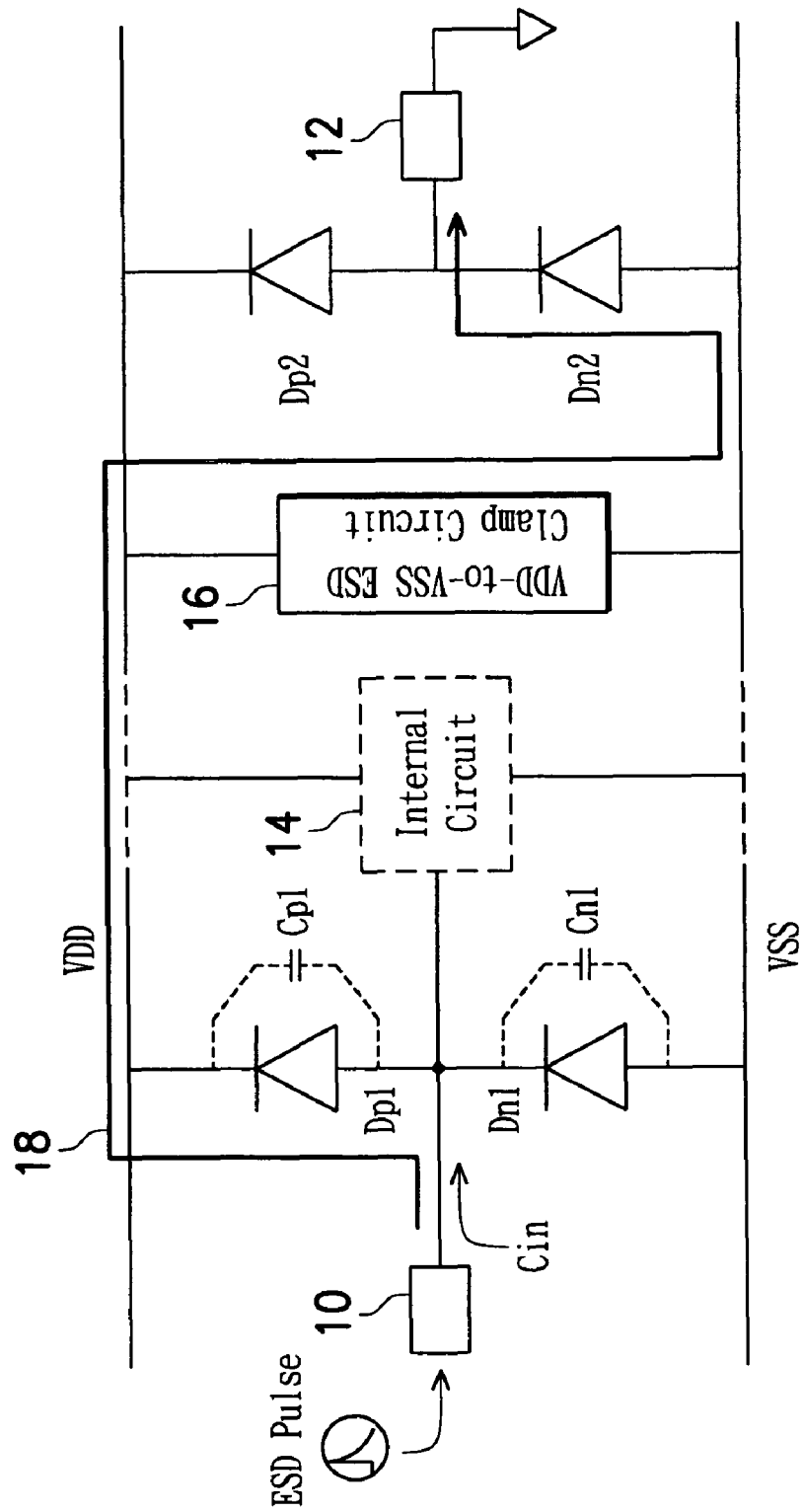
FIG. 1 is a circuit diagram of a conventional input ESD protection circuit with a VDD-to-VSS ESD clamp circuit.
Figure 2:
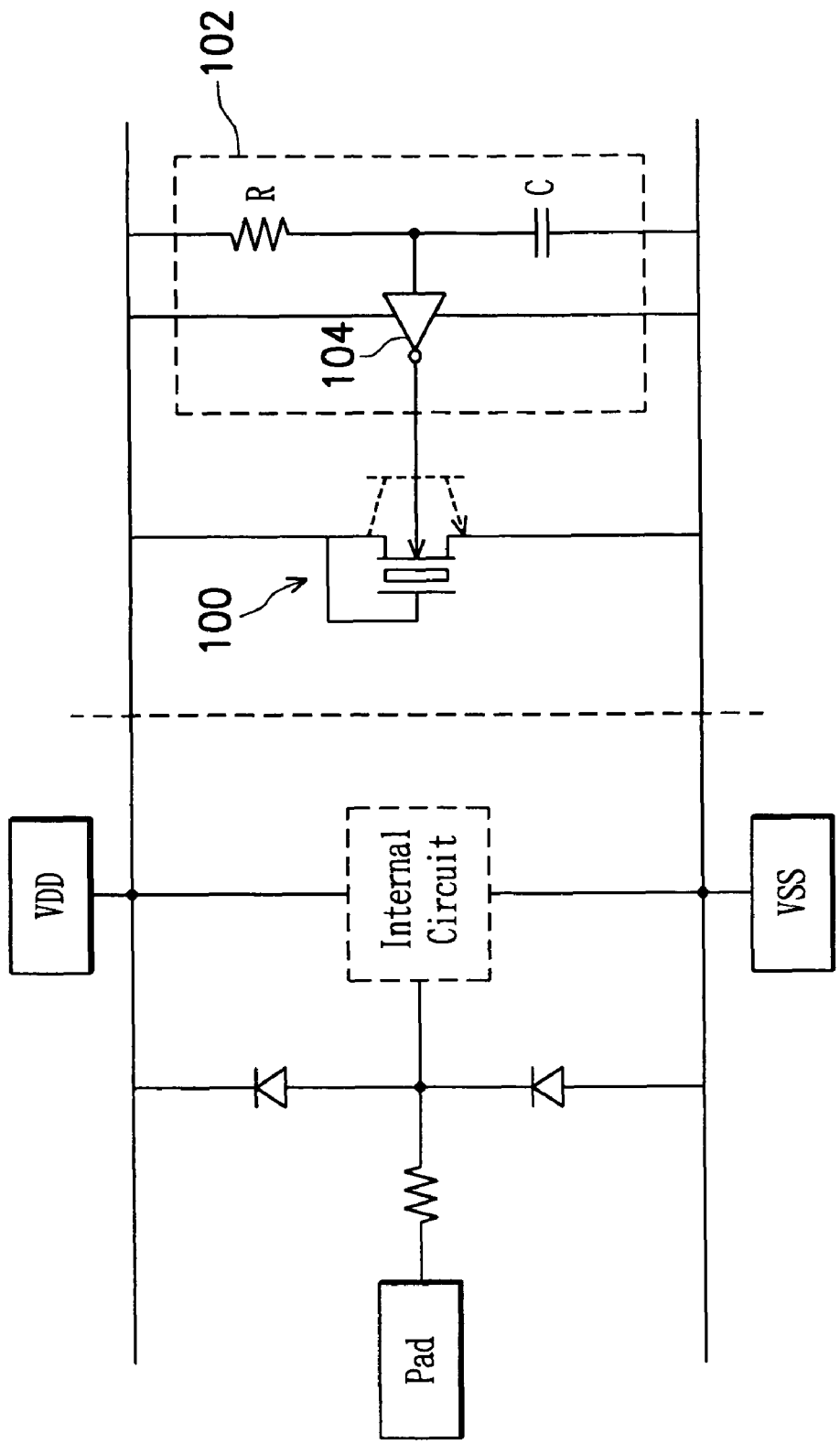
FIG. 2 is a circuit diagram of a conventional ESD protection circuit.
Figure 3:
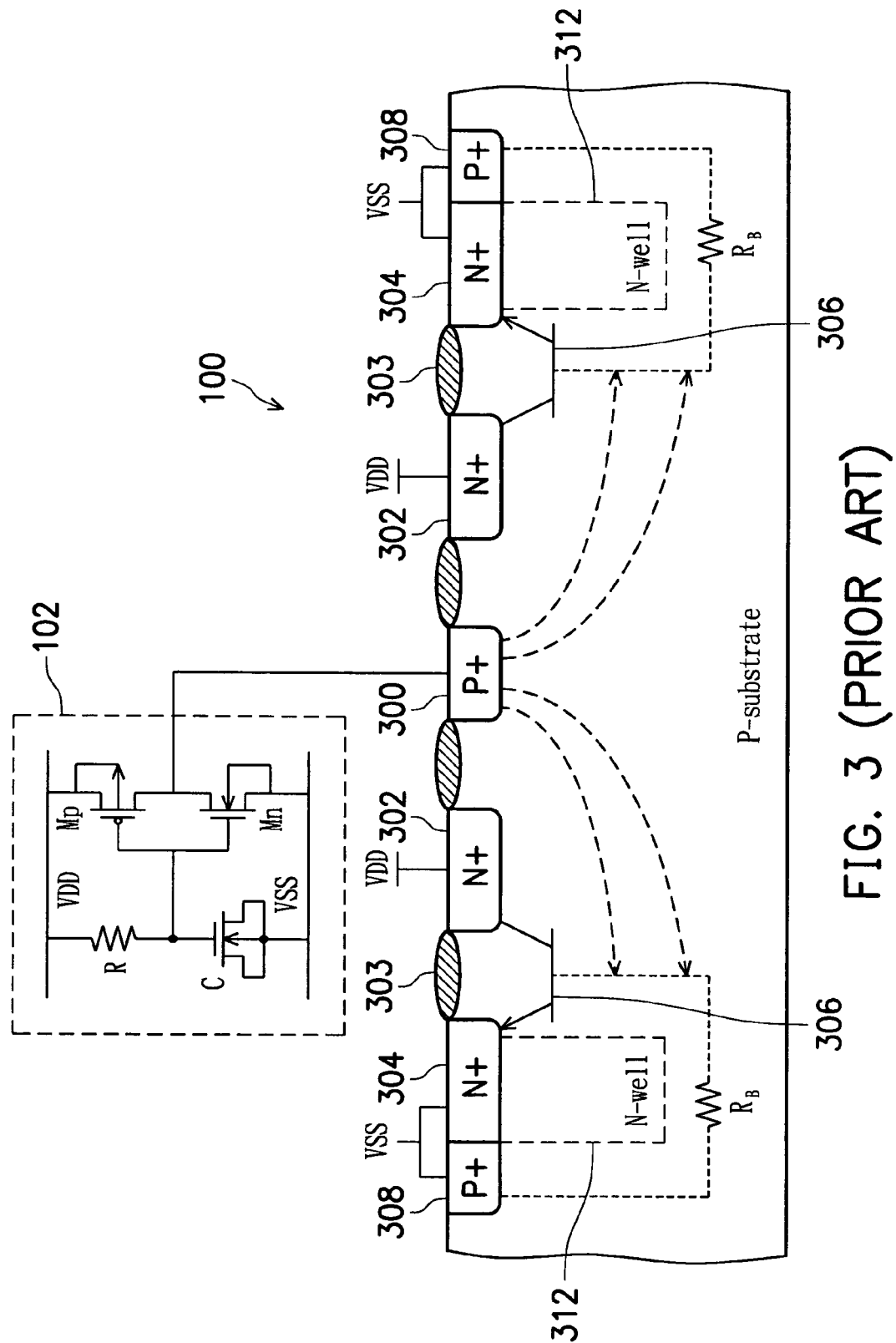
FIG. 3 is a cross-section of the ESD protection circuit shown in FIG. 2.
Figure 4:
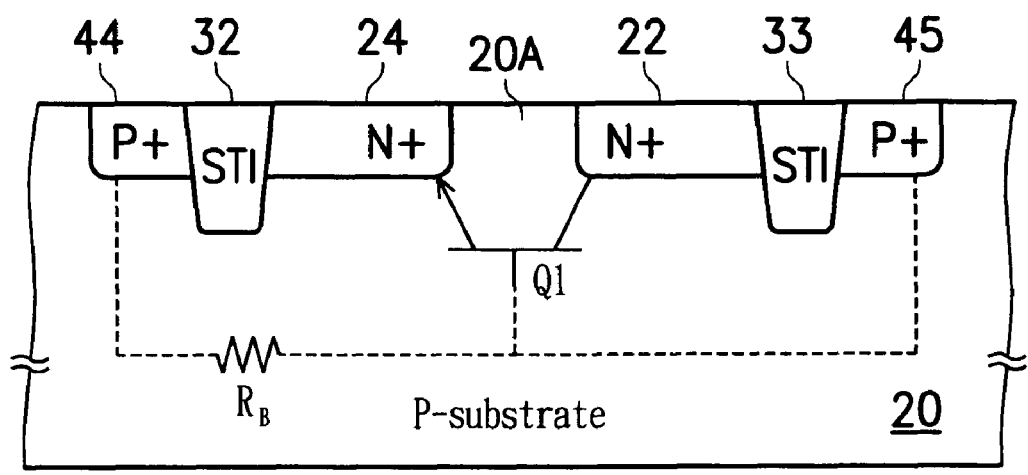
FIG. 4 is a cross-section of the STLBJT device in accordance with the first embodiment of the present invention.

The main concept of the present invention is to utilize a novel substrate-triggered lateral bipolar junction transistor (STLBJT) device as an ESD protection device. FIG. 4 is a cross-section of the STLBJT device in accordance with the first embodiment of the present invention. As shown in FIG. 4, the STLBJT device comprises two N-type regions 22 and 24 and two P-type regions 44 and 45 inside a P-type substrate 20. Both the N-type regions 22 and 24 are located between the P-type regions 44 and 45. The N-type regions 22 and 24 are close but not connected, and isolated by a substrate region 20A of P-type substrate 20. The N-type region 22, the P-type substrate region 20A and the N-type region 24 constitute the collector, base and emitter of the STLBJT device Q1. There is no STI or field oxide formed on the base of the STLBJT device Q1 (region 20A) between the N-type regions 22 and 24. Therefore, the STLBJT device can be triggered more efficiently than the conventional field oxide device. In addition, there are STI structures 33 and 32 between the N-type region 22 and the P-type region 45 and between the N-type region 24 and the P-type region 44, respectively, where the symbol $R_B$ denotes the substrate resistance. In operation, the P-type region 45 receives a signal to bias the base of the STLBJT device Q1 and triggers on the STLBJT device Q1 to bypass the ESD current.

Figure 5:
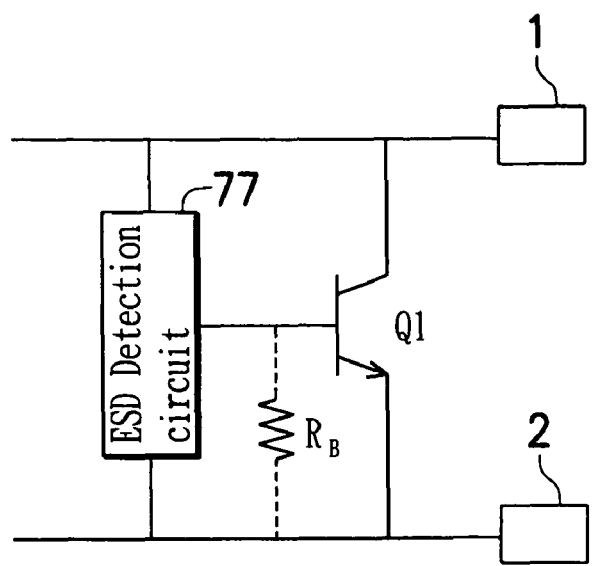
FIG. 5 is a block diagram of the ESD protection circuit using the STLBJT device as an ESD protection device in accordance with the first embodiment of the present invention.

FIG. 5 is a block diagram of the ESD protection circuit including the STLBJT device Q1 in accordance with the first embodiment of the present invention. The ESD protection circuit provides a discharge path between pad 1 and pad 2, such as the pads of the VDD and VSS power rails, and includes a STLBJT device Q1 and ESD detection circuit 77. The collector and emitter of the STLBJT device Q1 are respectively coupled to pad 1 and pad 2 and its gate is coupled to the output of the ESD detection circuit 77. The ESD detection circuit 77 is designed to detect the ESD event across the pad 1 and the pad 2. When an ESD event occurs, the STLBJT device Q1 is substrate-triggered to provide a path for discharging the ESD current. As described above, the advantage of the present embodiment is that the STLBJT device Q1 can be triggered more efficiently than the conventional field oxide device, thus the ESD protection performance is strengthened.

Figure 6:
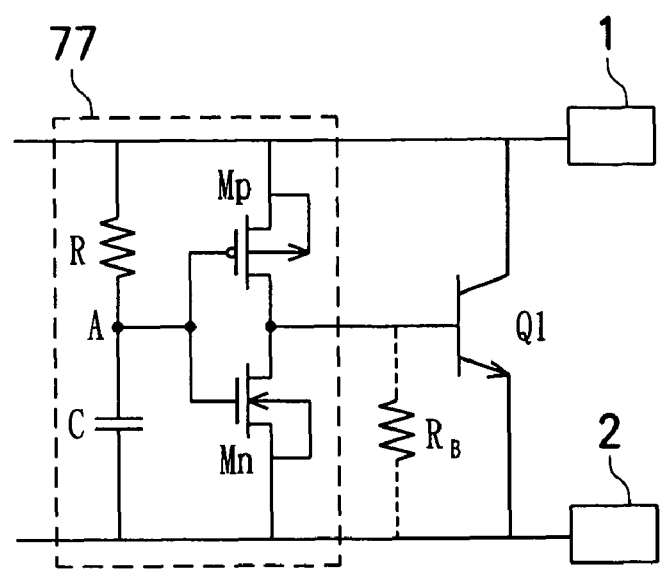
FIG. 6 is a circuit diagram of the ESD protection circuit shown in FIG. 5.

FIG. 6 is a circuit diagram of an example of the ESD protection circuit shown in FIG. 5. As shown in FIG. 6, the ESD detection circuit 77 is composed of a resistor R, a capacitor C, a PMOS transistor Mp and an NMOS transistor Mn. The RC network including resistor R and capacitor C has a delay constant longer than the duration of ESD pulses and shorter than the initial rising time of the signal on pad 1. As ESD pulses are applied to pad 1 and pad 2 is relatively grounded, node A maintains the low voltage level due to the longer delay constant of the RC network. Thus, the PMOS transistor Mp is turned on and the NMOS transistor Mn is turned off. Subsequently, the ESD current flows into the base of the STLBJT device Q1 through the PMOS transistor Mp, triggering on the STLBJT device Q1. Thus, the ESD current flows from pad 1 to pad 2 through the turned-on STLBJT device Q1.

Figure 7:
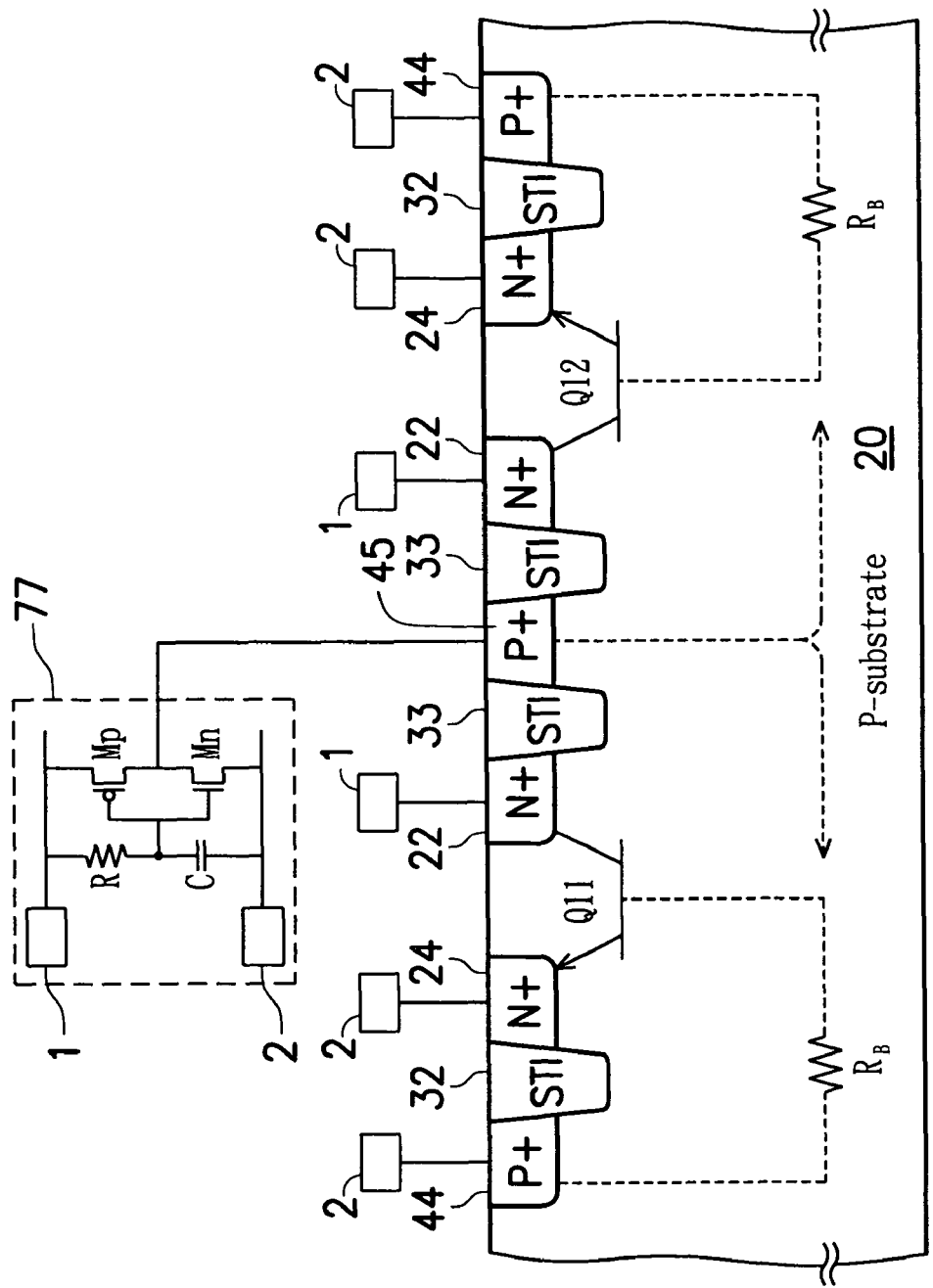
FIG. 7 is a partial cross-section of the ESD protection circuit in accordance with the first embodiment of the present invention.

FIG. 7 is a partial cross-section of the ESD protection circuit in accordance with the first embodiment of the present invention, where the STLBJT device is illustrated with a cross-section and the ESD detection circuit 77 with a circuit diagram. As shown in FIG. 7, the output of the ESD detection circuit 77 is coupled to P-type region 45. In addition, the N-type regions 22 (i.e. the collectors) of the STLBJT devices Q11 and Q12 are coupled to pad 1, the N-type regions 24 (i.e. the emitters) are coupled to pad 2 and the P-type regions 44 are also coupled to pad 2. The signal coming from the ESD detection circuit 77 can trigger the STLBJT devices Q11 and Q12, respectively, to provide paths for discharging the ESD current.

Figure 8A:
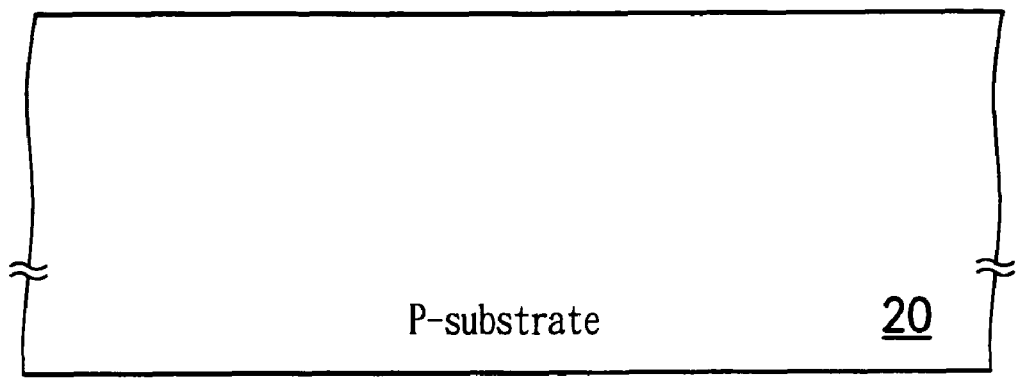
FIGS. 8a~8d are cross-sections illustrating the manufacturing process of the STLBJT device in the present embodiment.
Figure 8B:
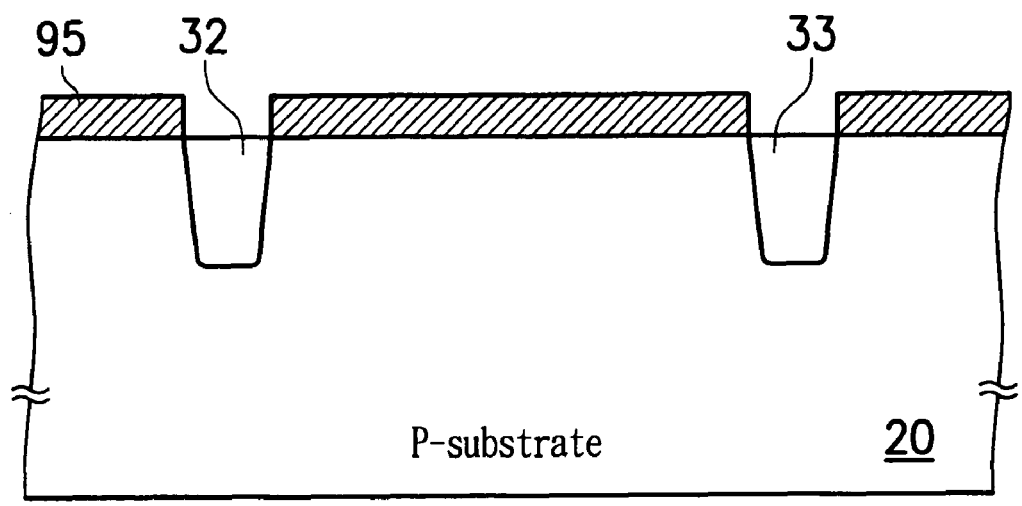
Figure 8C:
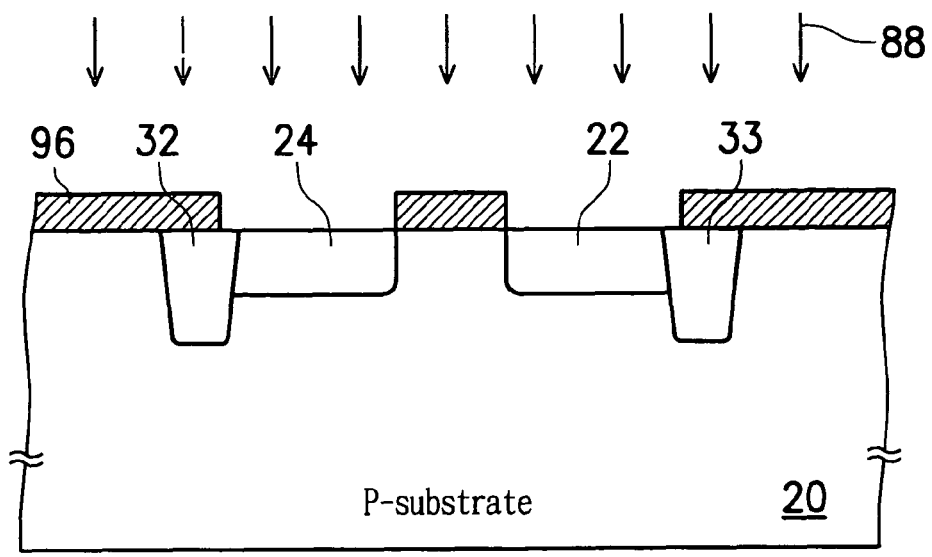
Figure 8D:
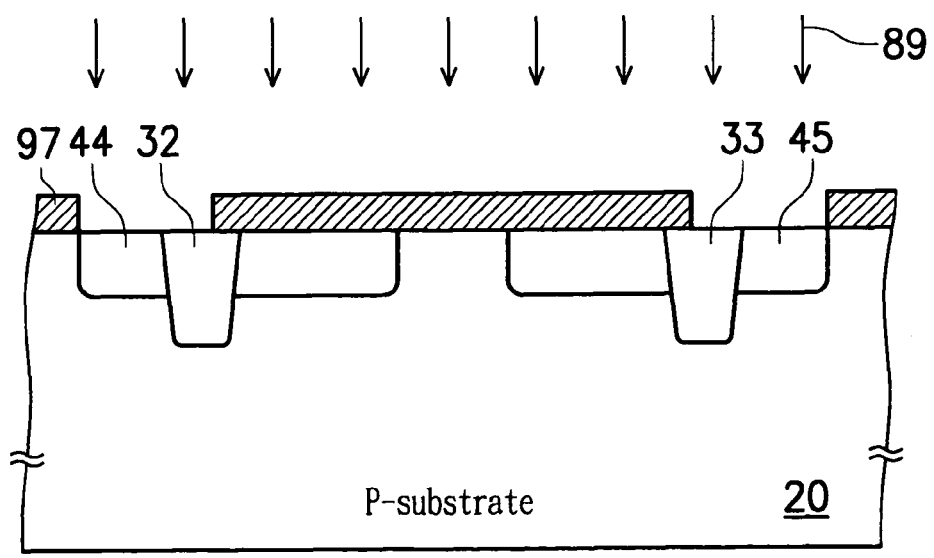

FIGS. 8a~8d are cross-sections illustrating the manufacturing process of the STLBJT device in the present embodiment. At first, in FIG. 8a, a P-type substrate 20 is prepared. In FIG. 8b, an active region mask 95 is defined by a photolithographic process and formed on the substrate 20. Then, the P-type substrate 20 is etched and filled with insulators like silicon dioxide or silicon nitride to form STI structures 32 and 33. In FIG. 8c, an N-type implantation mask 96 is defined by a photolithographic process. The N-type regions 22 and 24 are formed with an implantation of N-type impurities 88 using the N-type implantation mask 96. Finally, in FIG. 8d, a P-type implantation mask 97 is defined by a photolithographic process. Then the P-type regions 44 and 45 are formed with an implantation of P-type impurities 89 using the P-type implantation mask 97. The photolithographic process defining the P-type implantation mask 97 shown in FIG. 8d can be performed earlier than that defining the N-type implantation mask 96 shown in FIG. 8c. Using the process shown in FIGS. 8a~8d, the STLBJT device like that shown in FIG. 4 is formed on the P-type substrate 20.

Figure 9:
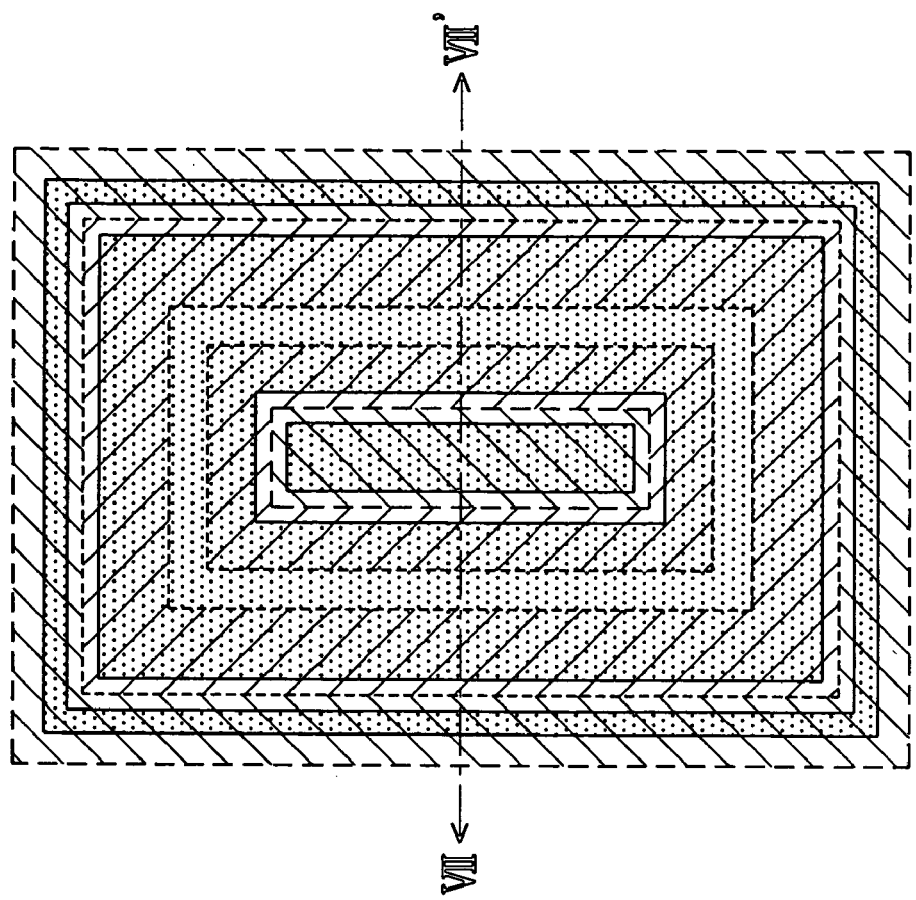
FIG. 9 is a layout view of the STLBJT device in accordance with the first embodiment of the present invention.

FIG. 9 is a layout view of the STLBJT device in accordance with the first embodiment of the present invention. As shown in FIG. 9, there are three key photo masks used to form the STLBJT device, including an oxide definition (usually called OD) photo mask for defining implantation regions, a P-type implantation photo mask for defining the base of the STLBJT device and an N-type implantation photo mask for defining the N-type collector and emitter of the STLBJT device. The cross-section in respect of the line VII-VII' is illustrated in FIG. 7. It is noticed that the above-mentioned photolithographic processes are available in and process-compatible with the current sub-quarter-micron CMOS process. Thus, there is no need to change or add new process steps to the existing process, which is favorable to the industrial application.

Second Embodiment

Figure 10:
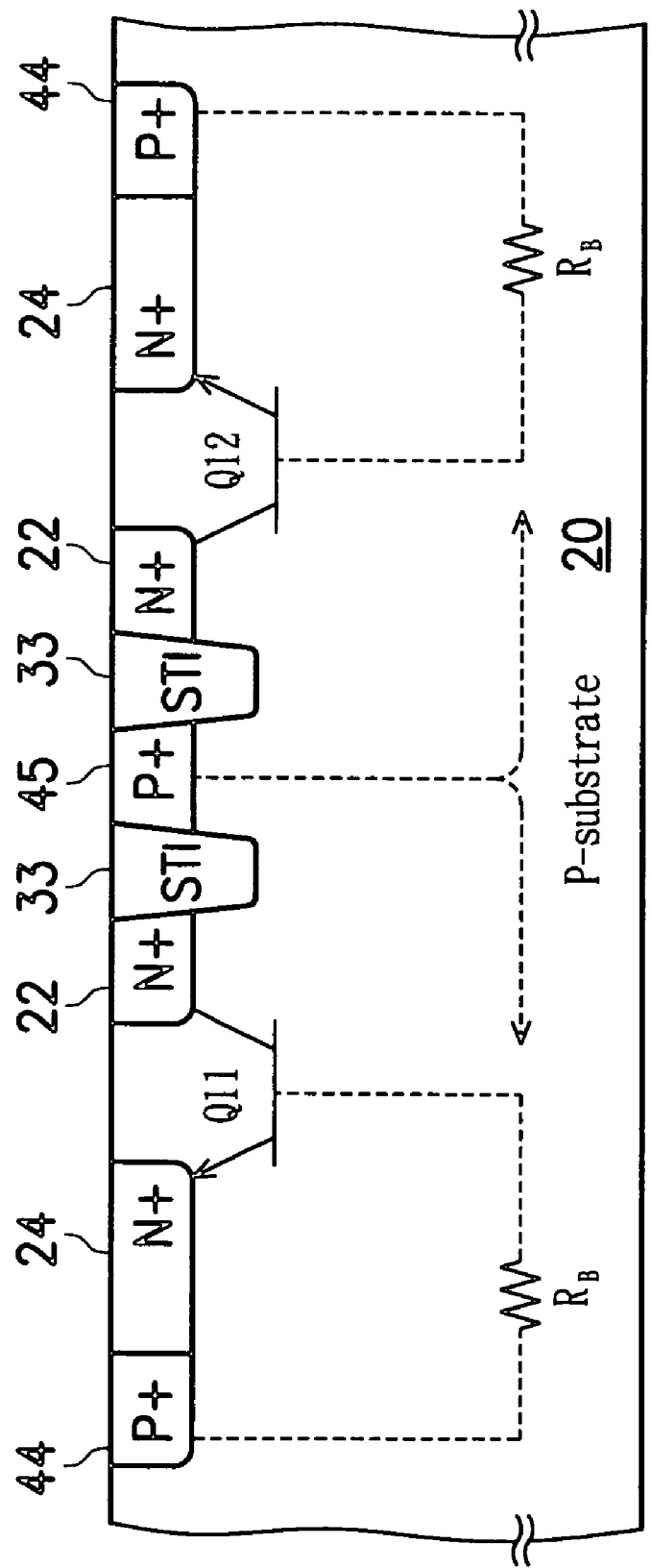
FIG. 10 is a cross-section of the STLBJT device in accordance with the second embodiment of the present invention.

The structure of the STLBJT device disclosed in the first embodiment of the present invention is not intended to limit the scope of the invention. In respect of different requirements, this device structure can be modified to achieve the same or better ESD protection performance. FIG. 10 is a cross-section of the STLBJT device in accordance with the second embodiment of the present invention. The difference in the STLBJT structures shown in FIG. 10 and FIG. 7 (the first embodiment) is that the STI structure 32 between N-type region 24 and the P-type region 44 is omitted, which can still achieve the object of the present invention.

Third Embodiment

Figure 11:
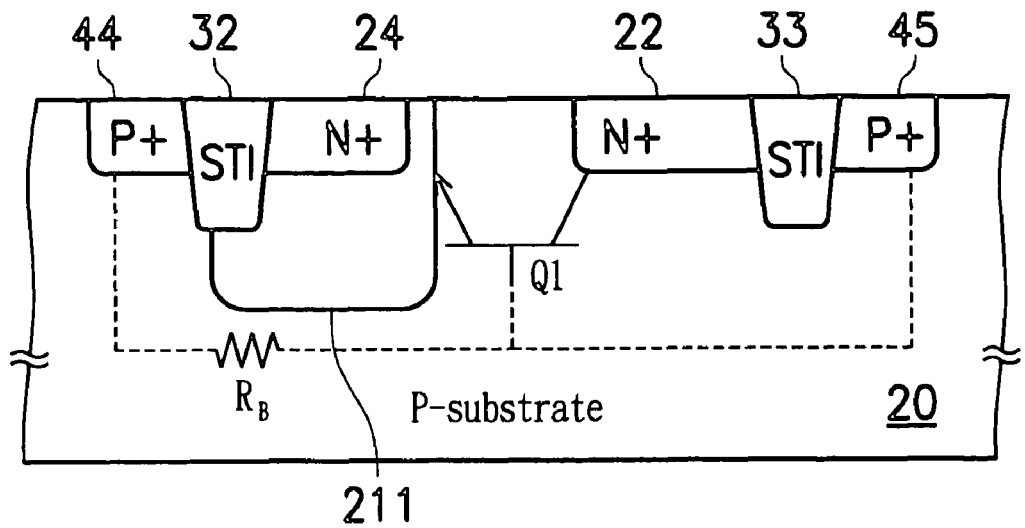
FIG. 11 is a cross-section of a first example of the STLBJT device in accordance with the third embodiment of the present invention.
Figure 12:
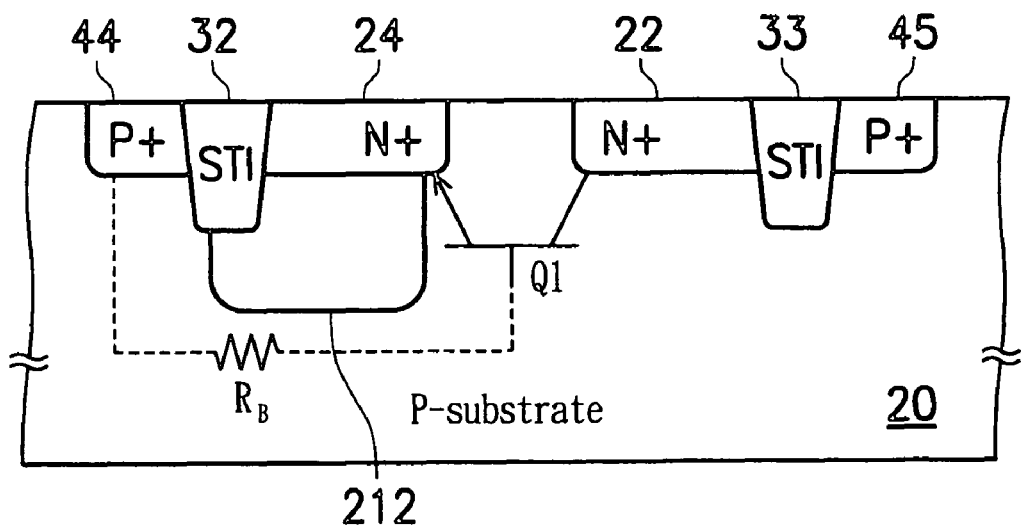
FIG. 12 is a cross-section of a second example of the STLBJT device in accordance with the third embodiment of the present invention.

In the present invention, an extra N-type doped region can be added in the STLBJT device structure shown in the first embodiment to increase substrate resistance $R_B$ or change emitter concentration, expediting the triggering operation. FIG. 11 is a cross-section of a first example of the STLBJT device in the present embodiment. As shown in FIG. 11, an N-type doped region 211 is formed under the N-type region 24 (i.e. the emitter) and on the side of the N-type region 24, that is, surrounding the N-type region 24, to increase the substrate resistance $R_B$. FIG. 12 is a cross-section of a second example of the STLBJT device in the present embodiment. As shown in FIG. 12, an N-type doped region 212 is formed just under the N-type region 24 to increase the emitter concentration. The formation of the N-type doped regions 211 and 212 is preferably made by the n-well formation step or the ESD implantation step.

Figure 13:
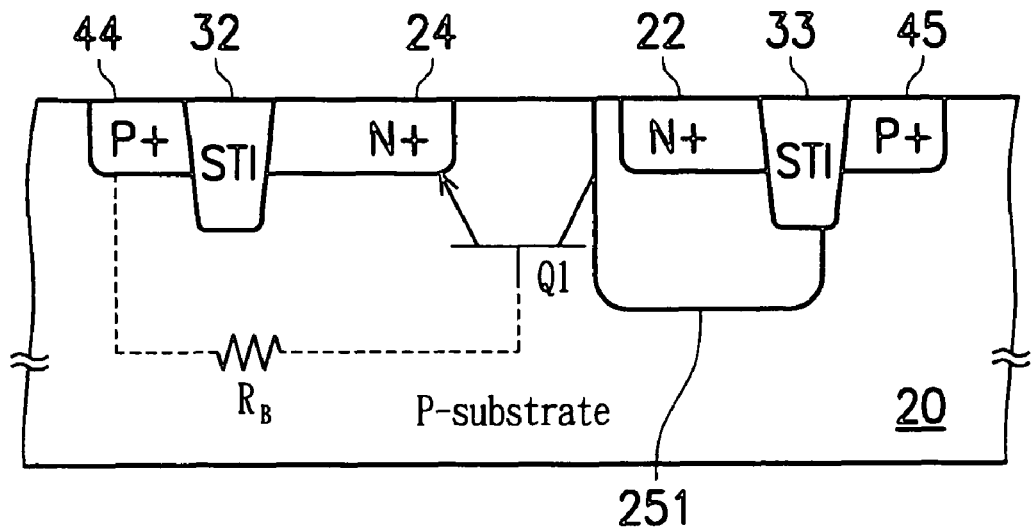
FIG. 13 is a cross-section of a third example of the STLBJT device in accordance with the third embodiment of the present invention.
Figure 14:
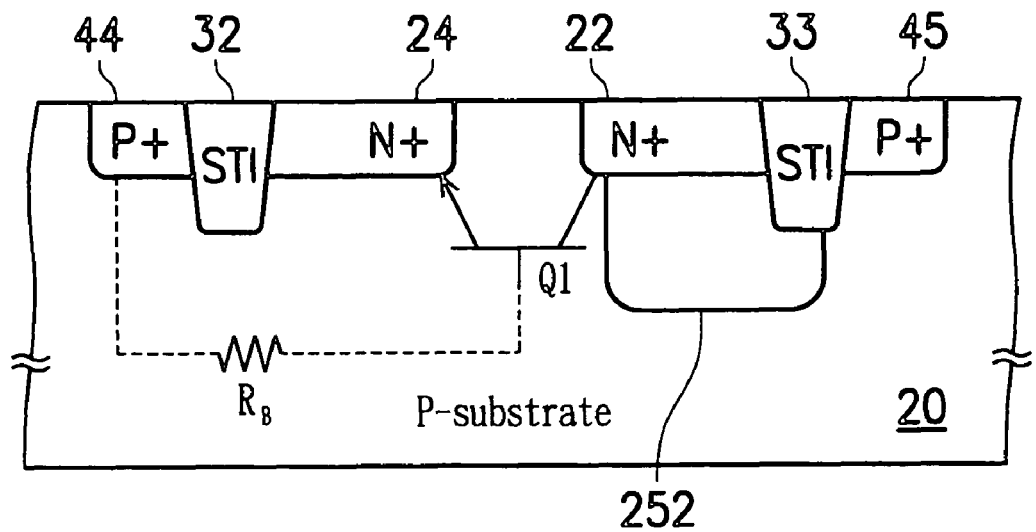
FIG. 14 is a cross-section of a fourth example of the STLBJT device in accordance with the third embodiment of the present invention.

In addition, the above-mentioned manipulation can also be applied to the collector of the STLBJT device. FIG. 13 is a cross-section of a third example of the STLBJT device in the present embodiment. As shown in FIG. 13, an N-type doped region 251 is formed under the N-type region 22 (i.e. the collector) and on the side of the N-type region 22, that is, surrounding the N-type region 22. FIG. 14 is a cross-section of a fourth example of the STLBJT device in the present embodiment. As shown in FIG. 14, an N-type doped region 252 is formed just under the N-type region 22 to adjust the substrate resistance and the collector concentration.

Fourth Embodiment

Figure 15:
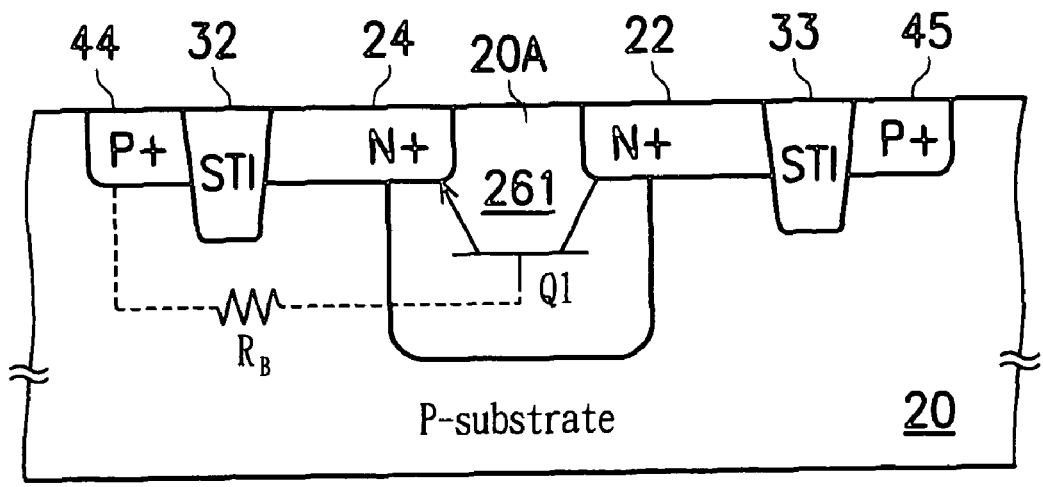
FIGS. 15~17 are cross-sections of the STLBJT devices containing P-type doped regions with different profiles.
Figure 16:
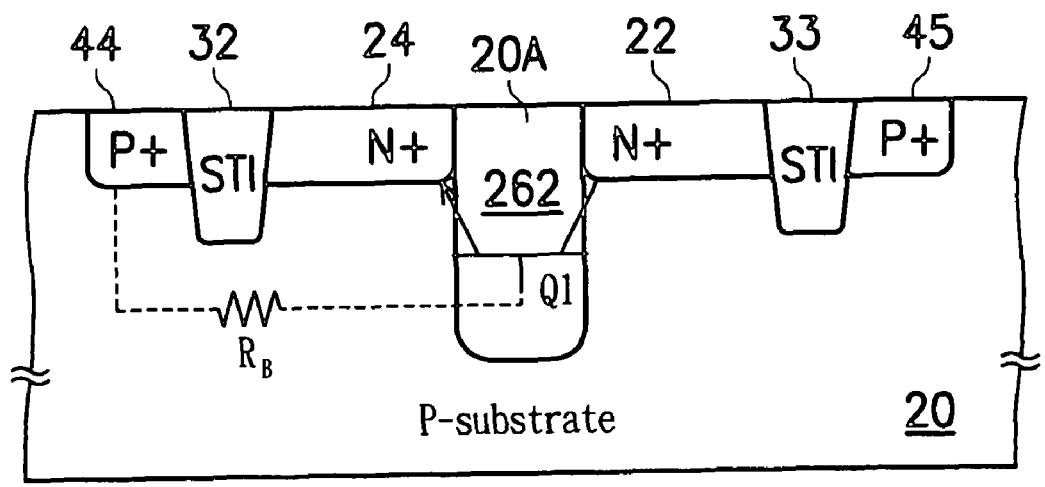
Figure 17:
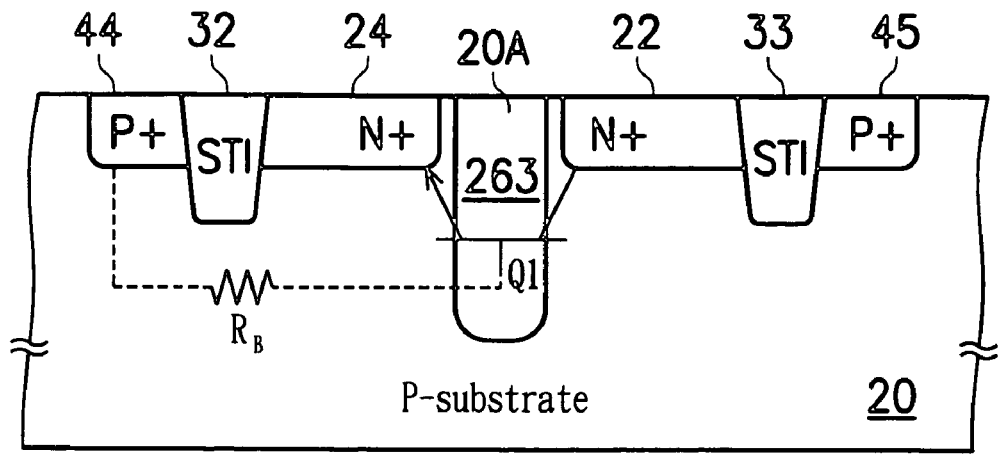

In the present invention, an extra P-type doped region can be added in the structure of the STLBJT device shown in the first embodiment to increase base resistance or base impurities. FIG. 15, FIG. 16 and FIG. 17 are cross-sections of the STLBJT devices containing P-type doped regions with different profiles. In FIG. 15, a P-type doped region 261 is formed under the substrate region 20A and the N-type regions 22 and 24. In FIG. 16, a P-type doped region 262 is formed under the substrate region 20A and laterally adjacent to the N-type regions 22 and 24. In FIG. 17, a P-type doped region 263 is formed under the substrate region 20A and its width is narrower than that of the substrate region 20A. The extra P-type doped regions shown in FIG. 15, FIG. 16 and FIG. 17 are used to increase the base resistance or the base impurity concentration.

Fifth Embodiment

Figure 18:
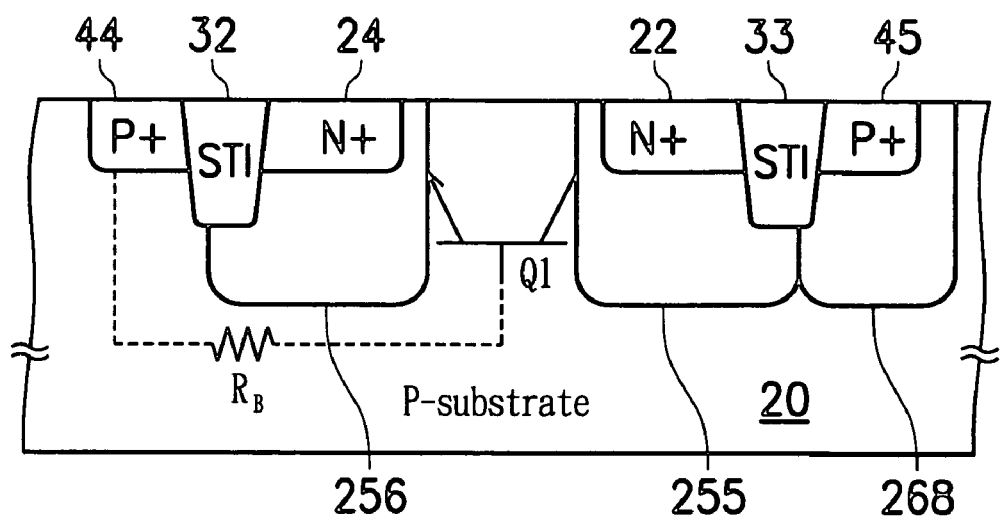
FIG. 18 is a cross-section of the STLBJT device in accordance with the fifth embodiment of the present invention.

In the above-mentioned third and fourth embodiments, extra N-type or P-type doped regions are formed in the substrate to improve the triggering performance of the STLBJT device in the present invention. In the present embodiment, several doped regions are formed in different regions to optimize the performance of the STLBJT device. FIG. 18 is a cross-section of the STLBJT device in the present embodiment. As shown in FIG. 18, an N-type doped region 256 formed by ESD implantation is added under the N-type region 24 (i.e. the emitter), an N-type doped region 255 formed by the N-well process is added under the N-type region 22 (i.e. the collector), and a P-type doped region 268 formed by the P-well process is added under the P-type region 45. In this case, the impurity concentration of N-type ESD implantation region 256 is higher than that of N-well region 255, which is further higher than that of P-well region 268. Thus, the triggering performance of the STLBJT device can be optimized.

According to the above description, the advantages of the STLBJT device serving as an ESD protection device and the ESD protection circuit using the same are as follows:

1. In the sub-quarter-micron process, the STLBJT device of the present invention can be triggered more efficiently than the field oxide device adopted in the conventional scheme. Therefore, the ESD protection circuit using the STLBJT device of the present invention as an ESD protection device can provide higher resistance to the ESD current. 2. The manufacturing process of the STLBJT device of the present invention is fully process-compatible with current sub-quarter-micron CMOS processes and does not require adding extra photo mask processes, and is thus easily incorporated to the current production line.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method, comprising:

in a substrate of a first dopant type, forming a first region and a second region of a second dopant type in respective first and second portions of a first surface of the substrate using a second dopant-type implantation photolithographic process, and wherein a third portion of the first surface constitutes the entirety of the first surface between the first and second portions, wherein the first and second regions are separated by a third region that is bounded in part by the third portion of the first surface, wherein the third region extends into the substrate between the first and second regions, and wherein the third region is constituted entirely of the substrate of the first dopant type;

forming a fourth region and a fifth region of the first dopant type in respective fourth and fifth portions of the first surface of the substrate using a first dopant-type implantation photolithographic process, wherein a sixth portion of the first surface constitutes the entirety of the first surface between the first and fourth regions, wherein a seventh portion of the first surface constitutes the entirety of the first surface between the second and fifth regions, and wherein the fourth region is formed in contact with the substrate; and forming first and second shallow trench isolation (STI) structures using an oxide definition photolithographic process, wherein the first STI structure is formed over a region between the first and fourth regions such that a portion of the first STI structure is bounded by the entirety of the sixth portion of the first surface, and wherein the second STI structure is formed over a region between the second and fifth regions such that a portion of the second STI structure is bounded by the entirety of the seventh portion of the first surface;

wherein the first, second, and third regions respectively constitute a collector, an emitter, and a base of a lateral bipolar junction transistor (BJT), wherein the lateral BJT does not include a field oxide or STI structure over any portion of the base, and wherein the lateral BJT is configured to trigger in response to the fourth region receiving an indication of an ESD event.

2. The method of claim 1, wherein the oxide definition photolithographic process, the implantation photolithographic process, and the second-type implantation photolithographic process are each CMOS process-compatible.

3. The method of claim 1, wherein the first dopant type is N-type and the second dopant type is P-type.

4. The method of claim 1, wherein the first dopant type is P-type and the second dopant type is N-type.

5. The method of claim 1, wherein the lateral BJT does not include a gate structure over any portion of the base, and wherein the first dopant type is P-type and the second dopant type is N-type.

6. A method, comprising:

forming a first region and a second region of a first dopant type in a substrate of a second dopant type different from the first dopant type, wherein the entirety of the region between the first and second regions along a surface of the substrate is composed of the substrate of the second dopant type;

forming a third region and a fourth region of the second dopant type in the substrate; and forming first and second shallow trench isolation (STI) structures, wherein the first STI structure is in contact with both the first and third regions, and wherein the second STI structure is in contact with both the second and fourth regions;

wherein the first region, the second region, and the region between the first and second regions respectively constitute a collector, an emitter, and a base of a bipolar junction transistor (BJT), wherein the BJT does not have a field oxide or STI structure over any portion of the base, and wherein the BJT is configured to trigger in response to the third region receiving an indication of an ESD event.

7. The method of claim 6, wherein the first dopant type is P-type and the second dopant type is N-type.

8. The method of claim 6, wherein the first and second regions are formed using a second dopant-type implantation photolithographic process, and wherein the third and fourth regions are formed using a first dopant-type implantation photolithographic process.

9. The method of claim 8, wherein the first dopant-type implantation photolithographic process and the second dopant-type implantation photolithographic process are each CMOS process-compatible.

10. The method of claim 6, wherein the first dopant type is N-type and the second dopant type is P-type.

11. The method of claim 6, wherein the BJT does not include a gate structure over any portion of the base, and wherein the first dopant type is N-type and the second dopant type is P-type.

12. A method for forming a bipolar junction transistor (BJT) configured to bypass ESD current, the method comprising:

in a first planar surface of a substrate of a first dopant type, forming a first region and a second region of a second dopant type different from the first dopant type, wherein the first and second regions are formed such that there is a substrate region that is bounded in part by the entirety of the first planar surface between the first and second regions, wherein the substrate region is constituted entirely of the substrate;

forming a third region and a fourth region of the first dopant type in the first planar surface of the substrate; and forming first and second shallow trench isolation (STI) structures in the first planar surface, wherein the first STI structure is formed between and abuts the first and third regions, and wherein the second STI structure is formed between and abuts the second and fourth regions;

wherein the first region, the second region, and the substrate region respectively formed a collector, an emitter, and a base of the BJT, and wherein the BJT is configured to trigger in response to the third region receiving an indication of an ESD event, wherein the indication of the ESD event is different from the ESD current to be bypassed; and wherein the BJT does not include an field oxide or STI structure over any portion of the base.

13. The method of claim 12, wherein the first and second regions are formed using a second dopant-type implantation photolithographic process, and wherein the third and fourth regions are formed using a first dopant-type implantation photolithographic process.

14. The method of claim 13, wherein the first dopant-type implantation photolithographic process and the second dopant-type implantation photolithographic process are each CMOS process-compatible.

15. The method of claim 12, wherein the first dopant type is P-type and the second dopant type is N-type.

16. The method of claim 12, wherein the first dopant type is N-type and the second dopant type is P-type.

17. The method of claim 12, wherein the first region, the second region, and the substrate region have at least a first depth, wherein the substrate region is further bounded in part by a first side of the first region and a first side of the second region, wherein the first side of the first region opposes a second side of the first region that abuts the first STI structure, and wherein the first side of the second region opposes a second side of the second region that abuts the second STI structure.

18. The method of claim 12, wherein the BJT does not include a gate structure over the base of the BJT, and wherein the first dopant type is P-type and the second dopant type is N-type.

* * * * *

UNITED STATES PATENT AND TRADEMARK OFFICE
CERTIFICATE OF CORRECTION

| | | |
|---|---|---|
| PATENT NO. | : 7,951,681 B2 | Page 1 of 1 |
| APPLICATION NO. | : 11/180714 | |
| DATED | : May 31, 2011 | |
| INVENTOR(S) | : Ker et al. | |

It is certified that error appears in the above-identified patent and that said Letters Patent is hereby corrected as shown below:

Column 1, line 4, below "Title" insert -- CROSS-REFERENCE TO RELATED APPLICATION --.

Signed and Sealed this
Fourth Day of October, 2011

David J. Kappos
*Director of the United States Patent and Trademark Office*